United States Patent
Son et al.

(10) Patent No.: US 6,968,495 B2
(45) Date of Patent: Nov. 22, 2005

(54) SUPER HIGH SPEED VITERBI DECODER USING CIRCULARLY CONNECTED 2-DIMENSIONAL ANALOG PROCESSING CELL ARRAY

(75) Inventors: Hong Rak Son, Jeonju-si (KR); Young Su Park, Iksan-si (KR)

(73) Assignee: Hyoung Suk Kim, Kwangju Gwangyeok-Si (KR)

( * ) Notice: Subject to any disclaimer, the term of this patent is extended or adjusted under 35 U.S.C. 154(b) by 469 days.

(21) Appl. No.: 10/175,034

(22) Filed: Jun. 20, 2002

(65) Prior Publication Data

US 2002/0199154 A1 Dec. 26, 2002

(30) Foreign Application Priority Data

Jun. 21, 2001 (KR) ................................ 2001-35314

(51) Int. Cl.[7] .......................................... H03M 13/03
(52) U.S. Cl. ..................................................... 714/795
(58) Field of Search ............................... 714/795, 786, 714/746; 343/853

(56) References Cited

U.S. PATENT DOCUMENTS 4,087,787 A * 5/1978 Acampora .................. 714/795
6,504,515 B1 * 1/2003 Holt et al. .................. 343/853

OTHER PUBLICATIONS

"Error Bounds for Convolutional Codes and an Asymptotically Optimum Decoding Algorithm", by Andrew VITERBI, *IEEE Transactions of Information Theory*, vol. IT-13, No. 2, Apr. 1967, pp. 260-269.

"Maximum-Likelihood Sequence Estimation of Digital Sequences in the Presence of Intersymbol Interference", by David Forney, Jr., *IEEE Transactions on Information Theory*, vol. IT-18, No. 3, May 1972, pp. 363-377.

"BiCMOS Circuits for Analog Viterbi Decoders", by Mohammed Shakiba et al., *IEEE Transactions on Circuits and Systems-II: Analog and Digital Signal Processing*, vol. 45, No. 12, Dec. 1998, pp. 1527-1537.

"Simulated Performance of Analog Viterbi Detectors", by Richard Spencer, *IEEE Journal on Selected Areas in Communications*, vol. 10, No. 1, Jan. 1992, pp. 277-288.

* cited by examiner

Primary Examiner—Albert Decady
Assistant Examiner—Dipakkumar Gandhi
(74) Attorney, Agent, or Firm—Greenblum & Bernstein, P.L.C.

(57) ABSTRACT

A super high speed Viterbi decoder and decoding method with a circularly connected 2-dimensional analog processing cell array. The Viterbi decoder has a 2-dimensional parallel processing structure, in which analog processing cells are located at nodes of a trellis diagram. An output column of the analog processing cells is connected to a decoding column. Thus, the output column becomes a column right before the decoding column. A reference input signal given at a decoding column is propagated to the whole network, while its magnitude is reduced by an amount of an error metric on each branch. The circuit-based decoding is done by adding trigger signals to disconnect the path corresponding to logic 0 (or 1), and by observing its effect at the output column.

5 Claims, 3 Drawing Sheets

[Fig 1]
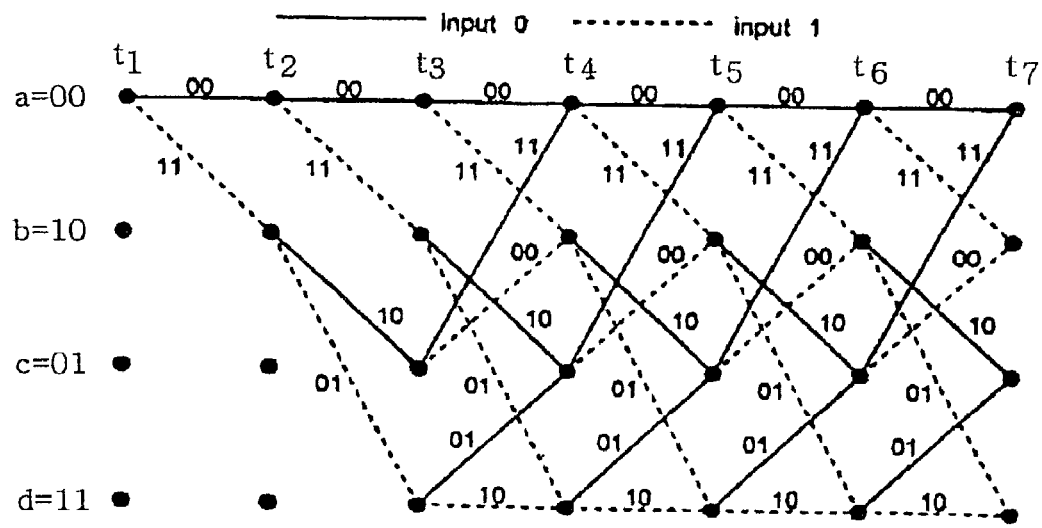
[Fig 2a]
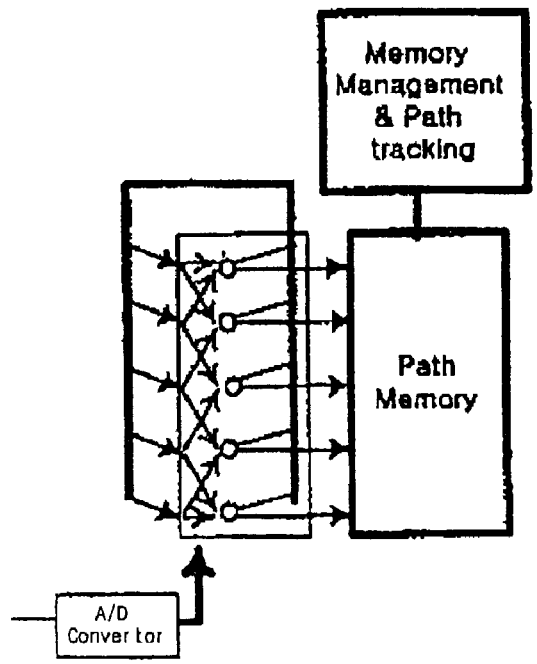

[Fig 2b]
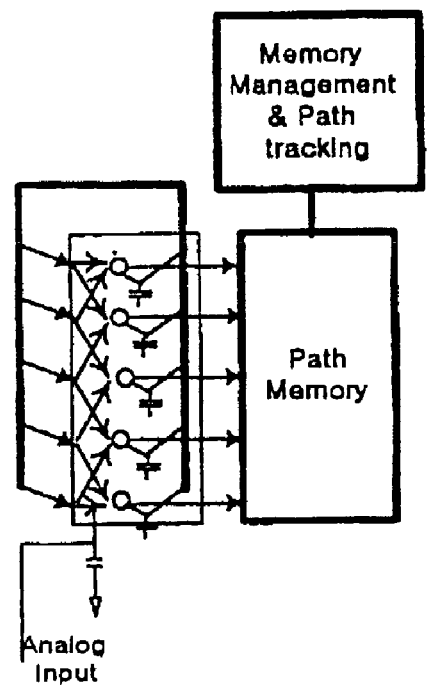
[Fig 3]
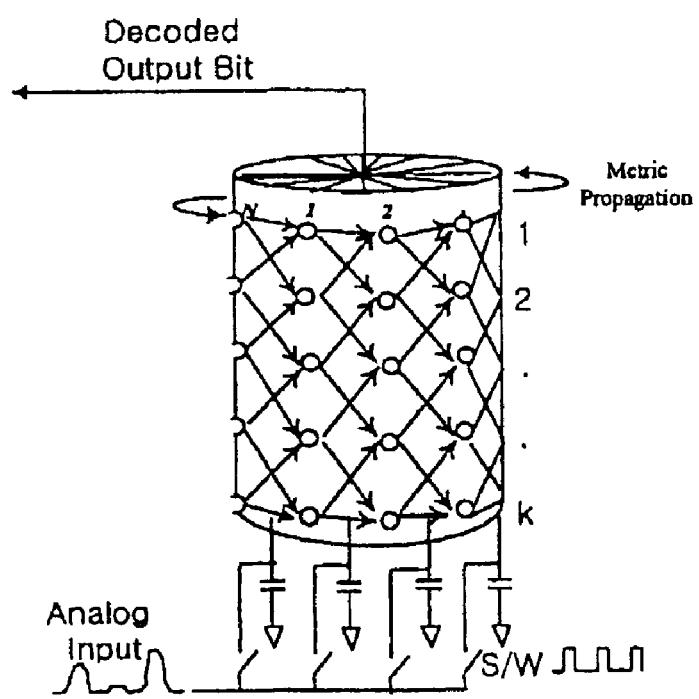

[Fig 4]
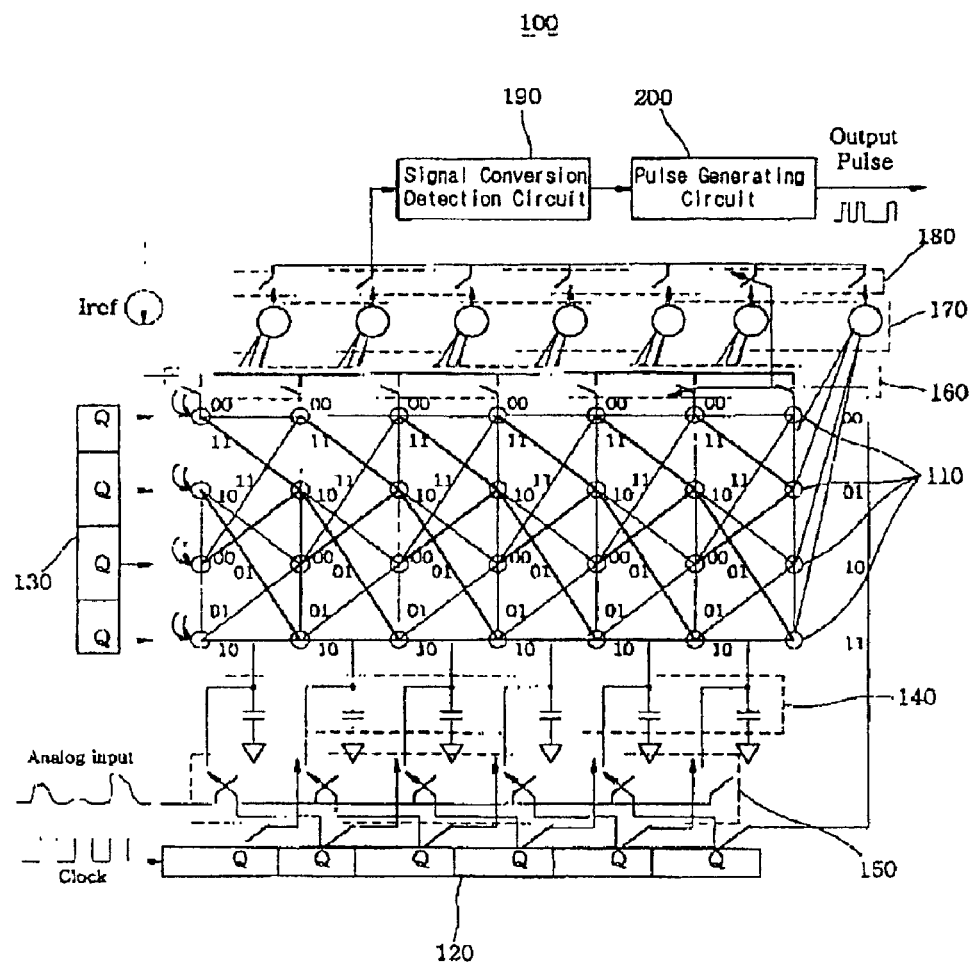

SUPER HIGH SPEED VITERBI DECODER USING CIRCULARLY CONNECTED 2-DIMENSIONAL ANALOG PROCESSING CELL ARRAY

BACKGROUND OF THE INVENTION

1. Field of the Invention

The present invention relates to a Viterbi decoder, and more particularly, to a super high speed Viterbi decoder and a decoding method using a circularly connected 2-dimensional analog processing cell array, which implement analog signal processing cells performing functions of nodes in a trellis diagram of the Viterbi decoder, have a 2-dimensional analog parallel processing structure, and have a circularly connected structure by connecting the output column cells with the decoding column cells in the 2-dimensional analog cell array, thereby not requiring any path memories and performing decoding at a super high speed.

2. Background of the Related Art

In high-speed data communication or high-density magnetic recoding media, the signals are easily distorted or contaminated by noise. Recovering the original data from the distorted or noisy signals is necessary. A Viterbi decoder is the one devised for such purpose, which decodes a convolution code using an optimization method.

The decoder is a simple model of a dynamic programming, which possesses excellent data correction efficiency by utilizing an optimal path obtained on the trellis diagram with code-symbol differences.

The Viterbi decoder accumulates the code-symbol difference (hereinafter, referred to as "code-symbol error") between a set of input code symbols and a set of reference code symbols assigned at branches of a trellis diagram shown in FIG. 1, searches for an optimum path which has minimum code-symbol error, and performs decoding depending on the position of the branch through which the optimum path passes. For example, in FIG. 1, if the optimum path which has the minimum value of the accumulated error passes a branch corresponding to a solid line of the trellis diagram, the decoder decodes to logic 0, but if the optimum path passes a dotted line, the decoder decodes to logic 1. With such algorithm of the Viterbi decoder, received code symbols could be corrected even though they are distorted or contaminated by noise in the communication system.

The Viterbi decoder obtains a globally optimal path via the calculation of the following [Expression 1] at each local node.

$$D_{i,j} = \min\{D_{k,l} + d_{ij,kl}, (k,l) \in S\} \qquad \text{[Expression 1]}$$

where $D_{k,l}$ is the shortest total distance from a cell (k, l) to its destination, $d_{ij,kl}$ is a local distance between a cell (i, j) and a cell (k, l). In the application of the Viterbi decoder, the local distance is assigned with the code-symbol error between a set of received code symbols and the one assigned on each branch of the trellis diagram. In addition, in the [Expression 1], S is a set of the cells in the vicinity of the cell (i,j), and min is a function for outputting the minimum value of enumerated items The processing of [Expression 1] is done at each node of the trellis diagram of the Viterbi decoder. For the decoding, each node of the trellis diagram accumulates the minimum value of the code symbol error at each branch with [Expression 1] onto the one transmitted from the former nodes.

In most of conventional Viterbi decoder chips, all nodes of the trellis diagram are not implemented with hardware circuits, but only the nodes of one column are implemented. During each processing stage, outputs of all nodes are stored in path memories for searching of the optimum path. FIG. 2a is a circuit diagram of a conventional digital decoder. The conventional digital Viterbi decoder shown in FIG. 2a requires an analog-digital converter which consumes lots of power. Also, the decoding speed is low due to the processing requirement of the multiple steps for determining the optimal path on the path memory.

To overcome such problem in the digital Viterbi decoder, a method using analog circuits for Viterbi decoder has been disclosed as shown in FIG. 2b. The power consumption in such analog Viterbi decoder is reduced and the decoding speed is improved significantly. However, the conventional analog Viterbi decoder still requires the digital path memories as included in the digital Viterbi decoder. Furthermore, it still has a speed limitation due to the back-tracking process for finding an optimum path on the path memories. IEEE Trans. Inform. Theory, vol. IT-13, pp-260–269, April 1967 disclose "Error bounds for convolutional codes and an asymptotically optimum decoding algorithm" written by A. J. Viterbi. IEEE Trans. Inform. Theory, vol. IT-18, pp. 363–378. y 1972 disclose "Maximum-likelihood sequence estimation of digital sequences in the presences of intersymbol interference" written by G. D. Forney, Jr. IEEE Trans. Circuits and Systems-II: Analog and Digital Signal Processing, pp. 1527–1537, vol. 45, no. 12, December 1998 disclose "BiCMOS circuits for analog Viterbi decoders" written by M. H. Shakiba, D. A. Johns, K. W. Martin. IEEE Journal of Selected areas in Communications, vol. 10, no. 1, January 1992 disclose "Simulated performance of analog Viterbi detectors" written by R. R. Spencer.

SUMMARY OF THE INVENTION

Accordingly, the present invention is directed to a super high speed Viterbi decoder and a decoding method using circularly connected 2-dimensional analog processing cell array that substantially obviate one or more problems due to limitations and disadvantages of the related art.

An object of the present invention is to provide a super high speed Viterbi decoder and a decoding method using a circularly connected 2-dimensional analog processing cell array, which implements an analog signal processing circuit which does not require the path memories for decoding, and which possesses a circularly connected structure in which an analog processing cell is assigned at each node of the trellis diagram, and which establishes the connection between the output column cells of 2-dimensional signal processing cells and the decoding column cells to consecutively perform the decoding, thereby achieving a faster decoding speed by performing the decoding with a circuit-based hardware trigger signals and successfully performing the decoding with decoding paths which are shorter than those of the conventional Viterbi decoder Additional advantages, object, and features of the invention will be set forth in part in the description which follows and in part will become apparent to those having ordinary skill in the art upon examination of the following or may be learned from practice of the invention. The objectives and other advantages of the invention may be implemented and attained by the structure particularly pointed out in the written description and claims hereof as well as the appended drawings.

To achieve the object and other advantages and in accordance with the purpose of the invention, as embodied and broadly described herein, there is provided a Viterbi decoder having a 2-dimensional processing structure in which analog processing cells are located on nodes of a trellis diagram, and a circularly connected structure in which the output column of the analog processing cells is connected with the decoding column and thus the output column becomes the column right before the decoding column.

The Viterbi decoder includes an analog signal processing cell array, a decoding column indicator, a state indicator, capacitors, first-switches, second-switches, a maximum arithmetic circuit, third-switches, a signal-variation detector, and a state transition circuit.

In another aspect of the present invention, there is also provided a decoding method using a circularly connected 2-dimensional analog processing cell array including the steps of: storing each set of analog code symbols in capacitors for each column in the analog cell array until all the capacitors for all the columns are filled with input code symbols; applying a code-symbol error which is the difference between the input code symbols and the symbols assigned at each branch, to a corresponding branch as an error metric; subtracting a code-symbol error for each branch from the cell output of the previous column and extracting a maximum one among signals inputted from all the connected branches; adding negative trigger signals to all outputs of the even-numbered(odd-numbered) cells at the next decoding column and observing the output of the column right before a current decoding column (hereinafter, referred to as "output column"); determining the decoded output for the code symbols stored at capacitors of the decoding column depending on the magnitude of an output variation at the output column due to the trigger signals; determining and indicating a new state and a new column for the next bit decoding and preparing the next bit decoding.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawing;

FIG. 1 is a diagrammatic view illustrating an example of a trellis diagram of a general Viterbi decoder;

FIG. 2a is a schematic block diagram illustrating the construction of a conventional digital Viterbi decoder;

FIG. 2b is a schematic block diagram illustrating the construction of a conventional analog Viterbi decoder;

FIG. 3 is a diagrammatic view of the construction of the super high speed Viterbi decoder using a circularly connected 2-dimensional analog processing cell array according to the present invention; and FIG. 4 is a circuit diagram illustrating a stretch of FIG. 3.

DETAILED DESCRIPTION OF THE PREFERRED EMBODIMENT

Reference will now be made in detail to the preferred embodiments of the present invention, examples of which are illustrated in the accompanying drawing.

In the present invention, the decoder and decoding method is implemented using an amended dynamic programming method obtained by modifying [Expression 1]. That is, it is assumed that $I_{ref}$ is a large reference value, $d_{ij,kl}$ is a code-symbol error given at the branch between cells (i, j) and (k, l), $D_{k,l}$ is an accumulated code-symbol error at the cell (k, l), and $y_{k,l}$ is a difference value between $I_{ref}$ and $D_{k,l}$. Then, $y_{k,l}$ can be written as [Expression 2].

$$y_{k,l}=I_{ref}-D_{k,l} \qquad \text{[Expression 2]}$$

[Expression 2] can be re-written as the following [Expression 3] in connection with $D_{k,l}$.

$$D_{k,l}=I_{ref}-y_{k,l} \qquad \text{[Expression 3]}$$

If $D_{k,l}$ is substituted into [Expression 1], the following [Expression 4] is obtained.

$$D_{i,j}=I_{ref}-\max\{y_{k,l}-D_{ij,kl};\ (k,l)\in S(i,j)\} \qquad \text{[Expression 4]}$$

where max is a mathematical arithmetic function for outputting the maximum value among the numerated items. Additionally, if $D_{k,l}$ in [Expression 2] is replaced with $D_{i,j}$, $y_{k,l}$ in [Expression 2] can also be re-written as $y_{i,j}$. Then, [Expression 2] becomes [Expression 5].

$$y_{i,j}=I_{ref}-D_{i,j} \qquad \text{[Expression 5]}$$

At this time, substituting $D_{i,j}$ in [Expression 4] into [Expression 5], the following [Expression 6] is obtained.

$$y_{i,j}=\max\{y_{k,l}-D_{ij,kl};\ (k,l)\in S(i,j)\} \qquad \text{[Expression 6]}$$

As described above, compared with [Expression 1], the right side of [Expression 6] is expressed by the maximum operation and subtraction. Providing that $y_{i,j}$ is available, the accumulated code-symbol error, $D_{i,j}$, can be obtained by substituting $y_{i,j}$ into [Expression 3]. Specifically, the cell output value $y_{i,j}$ of the decoding column becomes $I_{ref}$ in [Expression 5] since $D_{i,j}$ must be 0 at this location. The summary of the cell output at the decoding column is as follows.

$$y_{i,j}=\max\{u_{i,j},\ y_{k,l}-D_{ij,kl};\ (k,l)\in S(i,j) \qquad \text{[Expression 7]}$$

where $u_{i,j}$ is the following [Expression 8].

$$u_{i,j}=I_{ref} \qquad \text{[Expression 8]}$$

in the case where (i,j) is the cell designated by the decoding column indicator and the state indicator.

=O; otherwise

Providing the arithmetic cells located at each node of the trellis diagram perform the function of [Expression 7] and [Expression 8] and a large reference value $I_{ref}$ is applied at the cell input at the decoded location, the input reference value will be propagated while being reduced by the amount of corresponding $d_{ij,kl}$'s at each branch passed.

If an analog processing cell performs [Expression 7] and [Expression 8] in a parallel manner, the super high speed Viterbi decoder will be realized. FIG. 3 is a diagrammatic view of the construction of a super high speed Viterbi decoder using a circularly connected 2-dimensional analog processing cell array according to the present invention, and FIG. 4 is a circuit diagram illustrating a stretch of FIG. 3. In FIG. 4, the super high speed Viterbi decoder 100 using a circularly connected 2-dimensional analog processing cell array includes analog processing cells 110, a decoding column indicator 120, a state indicator 130, capacitors 140, first-switches 150, second-switches 160, a maximum arithmetic circuit 170, third-switches 180, a signal-variation detector 190, and a pulse generating circuit 200.

Each of the analog processing cell 110 is located at a node of the trellis diagram and performs both the subtraction of a code-symbol error from the propagated reference input signal and the maximum value extraction among incoming signals.

The decoding column indicator 120 is a shift register for indicating the current decoding column (hereinafter, referred to as "decoding column") by the location of the set bit.

The state indicator 130 functions to indicate a current state by the location of the set bit depending on a current state and a current output of the decoder.

The capacitors 140 include a set of capacitors per processor column as many as the number of code symbols for storing analog code symbols corresponding to each original data bit. The capacitors provide the code symbols at the branches located at the output terminal side of the corresponding decoding column.

The first-switches 150 include a set of switches for processor columns for storing the input code symbols in the capacitors of the corresponding decoding columns.

The second-switches 160 include a set of switches for applying large reference voltage to the cell designated by the decoding column indicator 120 and the state indicator 130 as its input.

The maximum value arithmetic unit 170 is a circuit for selecting and outputting a maximum value among the cell output values at each decoding column.

The third-switches include a set of switches for selecting and outputting the output of the maximum arithmetic circuit only at the output column (the column right before the decoding column).

The signal-variation detector 190 is a circuit for detecting the magnitude of the output variation of the output column and generating a decoded binary output value.

The pulse generating circuit 200 is a circuit for generating a decoded binary pulse signal based on the output of the signal variation detector 190.

The operation of the super high speed Viterbi decoder 100 using a circularly connected 2-dimensional analog-processing cell array will be described hereinafter.

When a set of code symbols corresponding to an original data bit are received, the first-switches 150 are switched by the decoding column indicator 120 and stores the input code symbols in a set of capacitors. Since the set position of the decoding indicator is sequentially shifted by one bit after each decoding, the input code symbols are stored in the capacitors in order. The stored location of the input code symbols is circulated and then reaches the original decoding column since the present invention is of the circularly connected structure in which the output column is connected co the current decoding column. The current state is indicated by the location of set bit of the state indicator 130. The first state is selected arbitrarily, and the next state is selected by a state transition logic in the current state indicator depending on the current decoding output and the current state.

The decoding starts when all the capacitors for all the decoding columns are filled with the received code symbols. The second-switches are controlled by the decoding column indicator 120 and the state indicator 130 to apply a reference input signals($I_{ref}$) to a specific cell, so that the reference input signals($I_{ref}$) is transmitted to all decoding columns and reaches the column right before the indicated decoding location. It should be noted that such column as indicated by the decoding column indicator and the column right before it are called "a current decoding column" (or "a decoding column") and "an output column", respectively. During the transmission of the input reference signals ($I_{ref}$), it is reduced by the amount of the code-symbol error at each branch. If the reduced reference signal reaches the output column (i.e., the column right before the decoding column), the maximum value among the cells at the output column is taken by the maximum arithmetic circuit 170. Selection of the max circuit at the output column is conducted by a third-switch controlled by the decoding column indicator 120.

To decode the code symbol stored at the current decoding column, negative trigger signals of same magnitudes are added to all outputs of the even-numbered (odd-numbered) cells of the next column of the decoding column and the signal variation at the output column is observed. If such variation at the output column is larger than a threshold, the code symbols are decoded into logic 0 or 1 depending on if the triggered even-numbered (odd-numbered) cells are connected to the branches corresponding to 0 or 1. Adding the negative signals to the outputs of some cells means that the cells are temporarily excluded from the optimum path since the cells at the next column performs the max operation. To detect the signal variation, the output signal of the output column is observed by the signal-variation detector 190. If the magnitude of such variation is larger than a threshold, the code symbols which stored in the capacitors of the decoding column are decoded into logic 0 (or logic 1) by the pulse generating circuit 200. The state indicator 130 indicates such new state and the column indicator 120 shifts its bit one step forward for the next bit decoding.

The decoded result is used at the state indicator 130 to determine a new state by the transition logic in the state indicator. Also, the set bit of the decoding column indicator 120 is shifted to the next bit to indicate the next decoding column.

As described above, the invented super high speed Viterbi decoder performs decoding without the path memories since it implements a trellis diagram of the Viterbi decoder as it is. Also, its decoding speed becomes faster since the decoding is done by the trigger signals on the circuits. Moreover, for the optimum path calculation at each node, the maximum arithmetic circuit having a simpler circuit is substituted for the minimum arithmetic circuit, and thereby, the entire construction of the circuit is simplified significantly.

It is to be understood that both the foregoing general description and the following detailed description of the present invention are exemplary and explanatory and are intended to provide further explanation of the invention as claimed.

What is claimed is:

1. A Viterbi decoder using a circularly connected 2-dimensional analog processing cell array, comprising: the Viterbi decoder having a 2-dimensional processing structure having a plurality of analog processing cells, each analog processing cell being located at each node on a trellis diagram, an output column of the analog processing cells being connected to a decoding column thereof, and thus, the output column becomes a column right before the decoding column.

2. The Viterbi decoder according to claim 1, wherein the effect of the negative trigger signals added to output of the next column of the decoding column circulates the whole circuit and appears as the output variation of the former column (output column) of the decoding column, and the magnitude of its variation is used to decode the code symbols of the decoding column, wherein the processing at each cell is done by employing the maximum arithmetic circuit which is the simpler circuit than minimum circuit, and wherein the 2-dimensional cell array of the trellis diagram is implemented with circuits as it is without the repeated use of the same circuits as in the digital Viterbi decoder.

3. A Viterbi decoder using a circularly connected 2-dimensional analog processing cell array, the Viterbi decoder comprising:

a plurality of analog arithmetic cells located at nodes of a trellis diagram and adapted to perform a subtraction and a maximum value arithmetic;

a decoding column indicator for indicating the location of a decoding column by the location of a set bit;

a state indicator for indicating a current state by the location of the set bit;

a plurality of capacitors each arranged to correspond to each decoding column for storing a set of code symbols per decoding column therein;

a plurality of first-switches for storing the code symbols in the plurality of capacitors;

a plurality of second-switches for applying large reference input voltages to the cell designated by the set bit locations of the decoding column indicator and the state indicator;

a maximum arithmetic circuit for taking a maximum value among the cell output values at each decoding column;

a plurality of third-switches for selecting the output of the output column right before a decoding column on the circularly connected 2-dimensional cell array where the decoding effect of the decoding column appears; and a signal-variation detector for detecting a variation in the output of the maximum arithmetic circuit which is selected by the plurality of third-switches and determining the decoded output.

4. The Viterbi decoder according to claim 3, wherein the effect of the negative trigger signals added to output of the next column of the decoding column circulates the whole circuit and appears as the output variation of the former column (output column) of the decoding column, and the magnitude of its variation is used to decode the code symbols of the decoding column, wherein the processing at each cell is done by employing the maximum arithmetic circuit which is the simpler circuit than minimum circuit, and wherein the 2-dimensional cell array of the trellis diagram is implemented with circuits as it is without the repeated use of the same circuits as in the digital Viterbi decoder.

5. A Viterbi decoding method using a circularly connected 2-dimensional analog processing cell array, the method comprising:

storing each set of analog code symbols in capacitors for each column in the 2-dimensional analog processing cell array until all the capacitors for all the columns are filled with input code symbols;

applying a code-symbol error which is a difference between the input code symbols stored in the capacitors and symbols assigned at each branch, to a corresponding branch as an error metric;

subtracting a code-symbol error for each branch from a cell output of a previous column and extracting a maximum one among signals inputted from all the connected branches;

adding negative trigger signals of same magnitudes to all outputs of one of even-numbered and odd-numbered cells at a next decoding column and observing the output of the output column that is before a decoding column;

determining the decoded output for the code symbols stored at the decoding column depending on the magnitude of an output variation at the output column due to the trigger signals;

determining and indicating a new state for a next bit decoding; and moving a set bit of a decoding column indicator to the next column for preparing the next bit decoding.

\* \* \* \* \*

UNITED STATES PATENT AND TRADEMARK OFFICE
CERTIFICATE OF CORRECTION

PATENT NO. : 6,968,495 B2 Page 1 of 1
APPLICATION NO. : 10/175034
DATED : September 20, 2005
INVENTOR(S) : H. B. Son et al.

It is certified that error appears in the above-identified patent and that said Letters Patent is hereby corrected as shown below:

On the title page. Item (73), Assignee, "Hyoung" should be --Hyong--.

Signed and Sealed this

Twenty-fifth Day of July, 2006

JON W. DUDAS
*Director of the United States Patent and Trademark Office*